United States Patent
Leffel (10) Patent No.: US 7,729,668 B2
(45) Date of Patent: Jun. 1, 2010

(54) INDEPENDENCE BETWEEN PATHS THAT PREDISTORT FOR MEMORY AND MEMORY-LESS DISTORTION IN POWER AMPLIFIERS

(75) Inventor: Michael David Leffel, Crystal Lake, IL (US)

(73) Assignee: Andrew LLC, Hickory, NC (US)

( * ) Notice: Subject to any disclaimer, the term of this patent is extended or adjusted under 35 U.S.C. 154(b) by 2185 days.

(21) Appl. No.: 10/406,959

(22) Filed: Apr. 3, 2003

(65) Prior Publication Data

US 2004/0196922 A1 Oct. 7, 2004

(51) Int. Cl.
H04B 1/04 (2006.01)

(52) U.S. Cl. ........... 455/114.3; 455/114.2; 455/63.1; 455/424; 370/284; 375/296

(58) Field of Classification Search ............ 455/63.1, 455/424, 114.2, 127; 330/149, 284; 375/296
See application file for complete search history.

(56) References Cited

U.S. PATENT DOCUMENTS

| | | | |
|---|---|---|---|
| 3,241,078 A | 3/1966 | Jones | 329/50 |
| 3,689,752 A | 9/1972 | Gilbert | 235/194 |
| 4,156,283 A | 5/1979 | Gilbert | 364/841 |
| 4,870,371 A | 9/1989 | Gottwald et al. | 330/149 |
| 4,879,519 A | 11/1989 | Myer | 330/149 |
| 4,978,873 A | 12/1990 | Shoemaker | 307/498 |
| 5,023,565 A | 6/1991 | Lieu | 330/151 |
| 5,049,832 A | 9/1991 | Cavers | 330/149 |
| 5,115,409 A | 5/1992 | Stepp | 364/841 |
| 5,119,040 A | 6/1992 | Long et al. | 330/140 |
| 5,130,663 A | 7/1992 | Tattersall, Jr. | 330/52 |
| 5,132,639 A * | 7/1992 | Blauvelt et al. | 330/149 |
| 5,323,119 A | 6/1994 | Powell et al. | 330/151 |
| 5,325,095 A | 6/1994 | Vadnais et al. | 342/22 |
| 5,414,383 A | 5/1995 | Cusdin et al. | 329/304 |
| 5,477,187 A | 12/1995 | Kobayashi et al. | 330/52 |
| 5,485,120 A | 1/1996 | Anvari | 330/151 |
| 5,491,454 A | 2/1996 | Matz | 330/149 |
| 5,528,196 A | 6/1996 | Baskin et al. | 330/151 |
| 5,594,385 A | 1/1997 | Anvari | 330/149 |
| 5,610,554 A | 3/1997 | Anvari | 330/52 |
| 5,617,061 A | 4/1997 | Fukuchi | 330/151 |
| 5,621,354 A | 4/1997 | Mitzlaff | 330/52 |
| 5,691,668 A | 11/1997 | Yoshikawa et al. | 330/151 |
| 5,732,333 A | 3/1998 | Cox et al. | 455/126 |
| 5,760,646 A | 6/1998 | Belcher et al. | 330/149 |
| 5,801,562 A * | 9/1998 | Fujii | 327/149 |

(Continued)

FOREIGN PATENT DOCUMENTS

EP 0 085 600 A1 1/1983

(Continued)

Primary Examiner—Nay A Maung
Assistant Examiner—Richard Chan
(74) Attorney, Agent, or Firm—Wood, Herron & Evans, LLP (57) ABSTRACT

A predistorter for reducing spurious emissions in an amplified signal including a first path configured to generated memory-less distortion correction and one or more second paths configured to generate memory distortion correction. The paths contain one or more dynamically controllable delay circuits that are configured such that the memory-less and memory distortion correction remains independent irrespective of frequency of use of the predistorter.

23 Claims, 4 Drawing Sheets

U.S. PATENT DOCUMENTS

| | | | | |
|---|---|---|---|---|
| 5,808,512 A | 9/1998 | Bainvoll et al. | | 330/151 |
| 5,831,478 A | 11/1998 | Long | | 330/52 |
| 5,862,459 A | 1/1999 | Charas | | 455/114 |
| 5,867,065 A | 2/1999 | Leyendecker | | 330/149 |
| 5,877,653 A | 3/1999 | Kim | | 330/149 |
| 5,892,397 A | 4/1999 | Belcher et al. | | 330/149 |
| 5,900,778 A | 5/1999 | Stonick et al. | | 330/149 |
| 5,912,586 A | 6/1999 | Mitzlaff | | 330/149 |
| 5,923,214 A | 7/1999 | Mitzlaff | | 330/52 |
| 5,929,703 A | 7/1999 | Sehier et al. | | 330/149 |
| 5,929,704 A * | 7/1999 | Proctor et al. | | 330/149 |
| 5,933,766 A | 8/1999 | Dent | | 455/103 |
| 5,959,499 A | 9/1999 | Khan et al. | | 330/149 |
| 5,986,499 A | 11/1999 | Myer | | 330/52 |
| 6,046,635 A | 4/2000 | Gentzler | | 330/149 |
| 6,052,023 A | 4/2000 | Myer | | 330/2 |
| 6,072,364 A | 6/2000 | Jeckeln et al. | | 330/149 |
| 6,075,411 A | 6/2000 | Briffa et al. | | 330/149 |
| 6,091,295 A | 7/2000 | Zhang | | 330/149 |
| 6,091,715 A | 7/2000 | Vucetic et al. | | 370/277 |
| 6,104,239 A | 8/2000 | Jenkins | | 330/2 |
| 6,118,335 A | 9/2000 | Nielsen et al. | | 330/2 |
| 6,118,339 A | 9/2000 | Gentzler et al. | | 330/149 |
| 6,125,266 A | 9/2000 | Matero et al. | | 455/126 |
| 6,137,335 A | 10/2000 | Proebsting | | 327/281 |
| 6,141,390 A | 10/2000 | Cova | | 375/297 |
| 6,144,255 A | 11/2000 | Patel et al. | | 330/151 |
| 6,148,185 A | 11/2000 | Maruyama et al. | | 455/115 |
| 6,154,641 A | 11/2000 | Zhang | | 455/112 |
| 6,157,253 A | 12/2000 | Sigmon et al. | | 330/10 |
| 6,208,846 B1 | 3/2001 | Chen et al. | | 455/127 |
| 6,211,733 B1 | 4/2001 | Gentzler | | 330/149 |
| 6,236,267 B1 | 5/2001 | Anzil | | 330/149 |
| 6,236,837 B1 | 5/2001 | Midya | | 455/63 |
| 6,255,908 B1 * | 7/2001 | Ghannouchi et al. | | 330/149 |
| 6,275,685 B1 | 8/2001 | Wessel et al. | | 455/126 |
| 6,285,251 B1 | 9/2001 | Dent et al. | | 330/127 |
| 6,285,255 B1 | 9/2001 | Luu et al. | | 330/149 |
| 6,304,140 B1 | 10/2001 | Thron et al. | | 330/149 |
| 6,337,599 B2 | 1/2002 | Lee | | 330/149 |
| 6,342,810 B1 | 1/2002 | Wright et al. | | 330/51 |
| 6,353,360 B1 | 3/2002 | Hau et al. | | 330/149 |
| 6,356,146 B1 | 3/2002 | Wright et al. | | 330/2 |
| 6,359,508 B1 | 3/2002 | Mucenieks | | 330/149 |
| 6,377,785 B1 | 4/2002 | Ogino | | 455/127 |
| 6,414,545 B1 | 7/2002 | Zhang | | 330/149 |
| 6,512,417 B2 | 1/2003 | Booth et al. | | 330/149 |
| 6,859,101 B1 * | 2/2005 | Leffel | | 330/280 |
| 2002/0168025 A1 * | 11/2002 | Schwent et al. | | 375/297 |

FOREIGN PATENT DOCUMENTS

| | | |
|---|---|---|
| EP | 0 367 457 B1 | 3/1996 |
| EP | 0 998 026 A1 | 5/2000 |
| EP | 0 948 131 B1 | 3/2002 |
| GB | 2 347 031 A | 8/2000 |
| WO | WO 97/08822 | 3/1997 |

* cited by examiner

INDEPENDENCE BETWEEN PATHS THAT PREDISTORT FOR MEMORY AND MEMORY-LESS DISTORTION IN POWER AMPLIFIERS

CROSS-REFERENCE TO RELATED APPLICATIONS

The subject matter of this application is related to the subject matter of U.S. patent application Ser. Nos. 09/395,490 and 10/068,343, filed on Sep. 14, 1999 and Feb. 5, 2002, respectively, the disclosures of which are fully incorporated herein by reference.

FIELD OF THE INVENTION

This invention relates generally to predistortion techniques used in radio frequency (RF) power amplifier systems, and more particularly, to a method and apparatus for predistorting signals amplified by an RF power amplifier in a wireless network.

BACKGROUND OF THE INVENTION

Wireless communication networks often use digital modulation schemes, the standards for which carry stringent requirements on out-of-band emissions. In addition, regulatory bodies, such as the Federal Communications Commission (FCC), for example, also limit out-of-band emissions.

One source of out-of-band emissions and/or undesired emissions in-band, collectively referred to herein as spurious emissions, are the RF power amplifiers used to transmit signals to mobile units, such as in a cellular network. Spurious emissions are often due to non-linearities, e.g., amplitude-to-amplitude (AM-AM) and amplitude-to-phase (AM-PM), as well as memory effects, in the response of the RF power amplifiers.

One manner of addressing these concerns is to use a technique referred to as "predistortion" to apply a correction to the input signals of these amplifiers to reduce non-linearities and the spurious emissions that result therefrom. However, conventional predistortion techniques often suffer from certain drawbacks, limiting their utility.

For example, RF based predistorters often contain a number of delay paths, each associated with a look-up table containing correction values, that may be used to provide some portion of a correction signal used to reduce non-linearities and memory effects in the response of the RF power amplifier. Further, these delay paths may be organized into layers. The first of these layers may be configured to provide AM-AM and AM-PM or memory-less distortion, while the second layer corrects for memory effects.

The correction values in the look-up tables may be initially generated for a particular operating frequency or channel for the RF power amplifier. So long as the RF power amplifier is used at this frequency, the correction values in look-up tables in their respective layers remain independent and a cancellation null occurs at the operating frequency, thus preventing a portion of the carrier frequency from appearing in the second layer RF paths. Further, the first and second layers may be turned on and off independently to determine the effectiveness of each layer, and to allow alignment and/or tuning.

However, if the RF power amplifier is used at some other frequency, a portion of the carrier frequency may appear in the second layer RF paths and result in a spurious emission. In order to prevent such a spurious emission, the correction values in the look-up tables in the first and second layers may be adjusted. Such an adjustment makes the correction values in the look-up tables in each layer interdependent. The interdependence of the correction values in the look-up tables in each layer generally prevents independent operation of each layer to allow for independent tuning and/or alignment.

Generation of the correction values in the look-up tables also becomes an iterative process when the correction values are interdependent. For example, in order to minimize spurious emissions in an interdependent system, correction values in the look-up table associated with the first layer are generated while the second layer is turned off. Next, the first layer is turned off while correction values for the look-up tables in the second layer are generated. Multiple iterations between the first and the second layers are often required to eliminate the presence of the carrier in the second layer RF paths, reducing any spurious emissions associated therewith. This process is repeated until the spurious emissions are eliminated or reduced to a satisfactory level.

In addition, the further the operating frequency is from the frequency used to generate the initial correction values in the look-up tables, the more iterative the process becomes. Thus, a frequency located at the center of the operating band of the RF power amplifier is typically selected to generate the initial correction values. RF power amplifiers used for digital modulation schemes typically have sufficient operating bandwidth to make generating correction values in the look-up tables in each layer difficult even when a frequency located at the center of the band is selected for initial generation of correction values. More particularly, those frequencies located at the upper and lower extremes of the operating band are typically the most difficult to generate correction values for, e.g., requiring a high number of iterations, and making the correction values in the look-up tables in each layer even more interdependent.

There is therefore a need to provide a predistorter capable of reducing spurious emissions in the response of an RF power amplifier with independent delay paths irrespective of the operating frequency of the RF power amplifier.

BRIEF DESCRIPTION OF THE DRAWINGS

The accompanying drawings, which are incorporated in and constitute a part of this specification, illustrate embodiments of the invention and, together with the detailed description given below, serve to explain the principles of the invention.

DETAILED DESCRIPTION OF THE DRAWINGS

The hereinafter-described embodiments utilize a predistorter capable of reducing spurious emissions in the response of an RF power amplifier with independent delay paths irrespective of the operating frequency of the radio frequency (RF) power amplifier. For example, a predistorter may comprise a first delay path configured to generate memory-less distortion correction in a first layer and short and long delay paths configured to generate memory distortion correction in a second layer. One manner of maintaining independence between the first and second layers in such a predistorter is to require that the delay added to the Layer 2 long path be an integer number of wavelengths long relative to the delay in the Layer 2 short path. To this end, and in accordance with principles of the present invention, at least one delay circuit may be located in at least one of the delay paths and configured to render the memory-less and memory distortion corrections independent from one another over a plurality of operating frequencies for the predistorter. Moreover, such delay circuits may be dynamically controlled, e.g., using a processor as described herein, such that the delay paths remain independent irrespective the operating frequency of the RF power amplifier.

By virtue of the forgoing, there is thus provide a predistorter capable of reducing spurious emissions in the response of an RF power amplifier with independent delay paths irrespective of the operating frequency of the RF power amplifier.

With reference to FIGS. 1-5, wherein like numerals denote like parts, there is shown a system comprising a RF power amplifier and a predistorter for use therewith. The predistorter is configured with delay paths arranged into first and second independent layers that remain independent irrespective of the operating frequency of the RF power amplifier. More specifically, the predistorter comprises three RF signal paths, each associated with a digitally based look-up table (LUT), organized into the first and second independent layers for producing a correction signal that is equal but opposite in magnitude and phase to non-linearities in the response of the RF power amplifier. A control signal fed back from the output of the RF power amplifier may be used to produce optimal sets of values in the LUTs.

Figure 1:
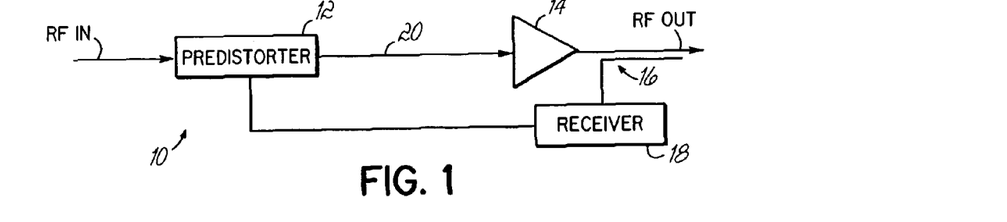
FIG. 1 is a block diagram of a radio frequency (RF) power amplifier system including a RF based predistorter in accordance with the principles of the present invention.

Referring first to FIG. 1, a block diagram of a RF power amplifier system 10 is shown for purposes of explaining the principles of the present invention. System 10 comprises RF based predistorter 12, RF power amplifier 14, coupler 16, and receiver 18. Predistorter 12 is configured to receive a digitally modulated RF input signal (RF IN) and generate a predistorted input signal there from, as is indicated at reference numeral 20.

Those skilled in the art will appreciate that a digital modulated RF input signal (RF IN) comprises a RF carrier frequency and a digital intelligence signal, e.g., voice or data. Moreover, a digital modulated RF input signal (RF IN) may be a code division multiple access (CDMA), a wide-band CDMA, a time division multiple access (TDMA), an enhanced through global system for mobile communications evolution (EDGE) signal, or other signal with a large peak to average power ratio, as will be appreciated by those skilled in the art.

RF power amplifier 14 is coupled to the output of predistorter 12 and is typical of RF amplifiers used to power amplify RF signals prior to transmission as wireless signals to mobile units in a wireless communications network, such as a cellular voice and/or data network. Moreover, RF power amplifier 14 may suffer from memory-less, e.g., amplitude-to-amplitude (AM-AM) and amplitude-to-phase (AM-PM) distortion, and memory characteristics in the transfer function, i.e., non-linearities, resulting in a distorted output signal. Receiver 18 coupled to the output of RF amplifier 14 through coupler 16 generates a control signal that is fed back to predistorter 12.

As configured in FIG. 1, these components apply a correction to the digitally modulated RF input signal (RF IN) such that the non-linearities in the response of RF power amplifier 14 are substantially cancelled and the linearity of the system 10 is improved. More specifically, the predistortion technique of the present invention comprises applying corrections to a digitally modulated RF input signal (RF IN) before the signal is applied to the RF power amplifier 14 such that the correction is equal but opposite in magnitude and phase to at least a portion of the distortion resulting from the RF power amplifier 14. Thus, the correction and some portion of the RF amplifier distortion cancel one another, resulting in a system 10 with a more linear transfer characteristic.

Turning now to FIGS. 2-5, block diagrams of possible hardware implementations of predistorter 12 (shown in FIG. 1), according to different embodiments of the present invention, are shown. Generally, the predistorters of FIGS. 2-5 comprise three delay paths organized into two independent layers, e.g., Layers 1 and 2. Associated with each delay path is a LUT for providing a portion of a correction signal to the RF input signal (RF IN).

For example, Layer 1 may provide AM-AM and AM-PM or memory-less distortion correction in the response of RF power amplifier 14 shown in FIG. 1, while Layer 2 may further correct for memory effects. To this end, Layer 1 may contain one RF signal or delay path, while Layer 2 contains two RF signal or delay paths. The three RF delay paths will be referred to hereinafter as the Layer 1 path and the Layer 2 long and short paths, based on relative time delays in each path.

Figure 2:
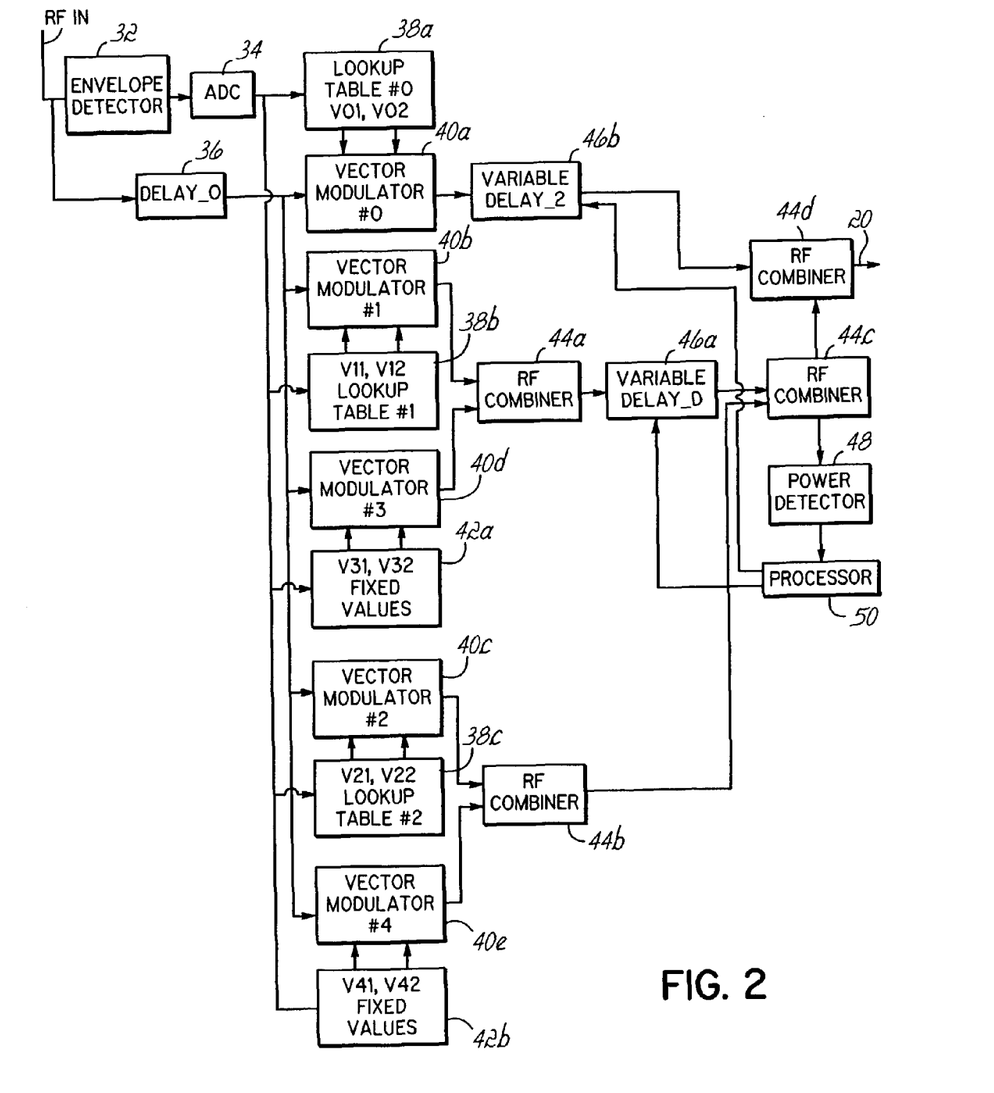
FIG. 2 shows a block diagram of an implementation of a time-advance RF based predistorter, in accordance with an embodiment of the present invention.

Referring now to FIG. 2, an exemplary predistorter 30 incorporating a Layer 1 path and Layer 2 long and short paths, and the components that comprise each such path, will be described. Predistorter 30 comprises envelope detector circuit 32, analog-to-digital converter (ADC) circuit 34, delay circuit (Delay__0) 36, LUTs 38a-c, vector modulators 40a-e, fixed value tables 42a, 42b, RF combiners 44a-d, variable delay circuits (Variable Delay_D, Variable Delay__2) 46a, 46b, power detector 48, and processor 50.

More specifically, a discrete diode is one example of an envelope detector circuit suitable for use in predistorter 30. Similarly, vector modulators 40a-e may be implemented using discrete vector attenuators controlled by digital-to-analog converters (DACs) coupled and responsive to LUTs. Each delay circuit and variable delay circuit may be implemented, for example, using delay cables, delay lines, delay coils, etc., that are either fixed or adjustable in nature.

Turning to the three delay paths, from input (RF IN) to output (indicated at reference numeral 20), the Layer 1 path comprises delay circuit (Delay__0) 36, vector modulator (Vector Modulator #0) 40a, variable delay circuit (Variable Delay__2) 46b, and RF combiner 44d. Similarly, the Layer 2 long path comprises delay circuit (Delay__0) 36, vector modulator (Vector Modulator #1) 40b, RF combiner 44a, variable delay circuit (Variable Delay_D) 46a, RF combiner 44c, and RF combiner 44d. The Layer 2 short path comprises delay circuit (Delay__0) 36, vector modulator (Vector Modulator #2) 40c, and RF combiners 44b-d.

In particular, in FIG. 2, the RF input signal (RF IN) is coupled to envelope detector circuit 32 and delay circuit (Delay__0) 36, splitting the signal between the envelope detector circuit 32 and the delay circuit (Delay__0) 36. Envelope detector circuit 32 produces an output signal proportional to the instantaneous value of the RF input power (RF IN). This signal is digitized by ADC circuit 34 whose digital output is used to recall pairs of control signal values, e.g., voltages $V_{01}$ and $V_{02}$, $V_{11}$ and $V_{12}$, and $V_{21}$ and $V_{22}$, from LUTs 38a-c, respectively. The pairs of control signals are applied to vector modulators 40a-c, whose functions are to modify the magnitude and phase of the RF input signal (RF IN) in accordance with the control signals. The portion of the RF input signal (RF IN) coupled to delay circuit 36, causes the RF input signal (RF IN) to arrive at vector modulators

40*a-c* at substantially the same time as the control signal values. Thus, the output of delay circuit (Delay_0) 36 is coupled to vector modulators 40*a-c*.

The output of vector modulator (Vector Modular #0) 40*a* is coupled to variable delay circuit (Variable Delay_2) 46*b*. The output of vector modulator (Vector Modular #1) 40*b* is coupled to variable delay circuit (Variable Delay_D) 46*a*. Vector modulator (Vector Modular #0) 40*a* is configured such that, in the absence of control signal inputs, the RF input signal (RF IN) passes through without, or with minimal, distortion, whereas vector modulators (Vector Modular #1) 40*b* and (Vector Modular #2) 40*c* are configured such that, in the absence of control signal inputs, little or no RF signal passes through. Thus, when control signals are applied, vector modulator (Vector Modular #0) 40*a* produces the original RF signal (RF IN) plus a predistorted signal, whereas vector modulators (Vector Modular #1) 40*b* and (Vector Modular #2) 40*c* produce essentially predistortion signals only, based on values in LUTs 38*a-c*.

In operation, a set of requirements may be used to describe the setting of variable delay circuits (Variable Delay_D, Variable Delay_2) 46*a*, 46*b*. The first of these requirements states that if no delay is added to the Layer 1 path, the Layer 1 path need have the same insertion phase and delay as the Layer 2 short path. The second requirement states that if no delay is added to the Layer 2 long path, the Layer 2 long path need have 180 degrees of additional insertion phase but the same insertion delay as the Layer 2 short path.

Once the first two requirements are satisfied, a third requirement states that an amount of delay, e.g., X nanoseconds (nS), may be added to the Layer 1 path using variable delay circuit (Variable Delay_2) 46*b*, while twice as much delay, e.g., 2X nS, may then be added to the Layer 2 long path using variable delay circuit (Variable Delay_D) 46*a*. It has been found that the amount of delay added, e.g., 2.5 to 5 nS, may be determined by the characteristics of the RF power amplifier that is being predistorted.

Based on these three requirements, a cancellation null will occur at the at the operating frequency of RF power amplifier 14 (shown in FIG. 1), so long as the operating frequency is the same as the frequency used to generate the correction values in the LUTs 38*a-c*. Moreover, the values in the LUT 38*a* and LUTs 38*b* and 38*c* remain independent, as do Layers 1 and 2.

However, as practical matter, it is often desirable to operate RF power amplifier 14 at some frequency other than the frequency used to generate the correction values in the LUTs 38*a-c*. When RF power amplifier 14 is operated at a frequency other than the frequency used to generate the correction values in the LUTs 38*a-c*, a cancellation null will not occur at the operating frequency and a portion of the original RF carrier signal appears at, or "bleeds through" to, the outputs of variable delay circuit (Variable Delay_D) 46*a* and vector modulator (Vector Modular #2) 40*c*, resulting in a spurious emission at the output of RF amplifier 14. It has been discovered that that the amount of bleed through is a function of both the carrier frequency and the amount of delay added, e.g. delay line length, etc.

One approach to preventing such a spurious emission, is to adjust the correction values in LUTs 38*a-c*. Such an adjustment makes the correction values in LUT 38*a* and LUTs 38*b* and 38*c* interdependent. The interdependence of the correction values in LUTs 38*a-c* in Layers 1 and 2 generally prevents independent operation of each layer that allows for independent tuning and/or alignment of the LUTs 38*a-c*.

Generation of the correction values in the LUTs 38*a-c* may also become an iterative process. For example, in order to minimize spurious emissions, correction values in LUT 38*a* in Layer 1 are generated while Layer 2 is turned off. Next, Layer 1 is turned off while correction values for LUTs 38*b* and 38*c* in Layer 2 are generated. Multiple iterations between Layers 1 and 2 are often required to eliminate the presence of the carrier in the Layer 2 long and short paths, reducing any spurious emissions associated therewith. This process is repeated until the spurious emissions are eliminated or reduced to a satisfactory level.

In addition, the further the operating frequency is from the frequency used to generate the initial correction values in LUTs 38*a-c*, the more iterative the process becomes. Thus, a frequency located at the center of the operating band of the RF power amplifier 14, shown in FIG. 1, is typically selected to generate the initial correction values. RF power amplifiers, such as RF power amplifier 14, used for digital modulation schemes typically have sufficient operating bandwidth to make generating correction values in LUTs 38*a-c* difficult even when a frequency located at the center of the band is selected for initial generation of correction values. More particularly, those frequencies located at the upper and lower extremes of the operating band are typically the most difficult to generate correction values for, e.g., requiring a high number of iterations, and making the correction values in LUTs 38*a-c* in Layers 1 and 2 more interdependent.

In accordance with the present invention, and to maintain independence of correction values in LUT 38*a* and LUTs 38*b* and 38*c* in Layers 1 and 2, respectively, a fourth requirement is provided. This fourth requirement states that the delay added to the Layer 2 long path, e.g., 2X nS, be an integer number of wavelengths long relative to the delay in the Layer 2 short path at the operating frequency.

The fourth requirement causes a cancellation null to occur centered at the operating frequency, irrespective of the correction values in LUT 38*a* and LUTs 38*b* and 38*c* in Layers 1 and 2. Thus, the LUTs 38*a-c* in each layer are independent and may be easily created. Moreover, since LUTs 38*a-c* are independent at all frequencies, one layer may be operated without impacting the performance of the other.

For example, the when the cancellation null occurs at the operating frequency of RF power amplifier 14, correction values in LUT 38*a* generated for Layer 1 correction are not impacted by the addition of correction associated with Layer 2. Moreover, correction values for LUT 38*a* may be generated and need not be modified after Layer 2 is made active. Additionally, activating Layer 2 does not impact the operating power of RF power amplifier 14 since the majority of the carrier power that may have bleed through Layer 2 is removed by the cancellation null. This independence of the correction values in the Layer 1 and Layer 2 LUTs 38*a-c* allows the LUTs 38*a-c* to be generated without iterating between the Layer 1 and Layer 2 paths.

Further, Layer 2 may be deactivated to allow the evaluation of the effectiveness of the Layer 1 correction, which may only occur when the correction values in LUTs 38*a-c* are independent. The ability to deactivate Layer 2 correction may be particularly advantageous if there is a failure in the Layer 2 circuitry and Layer 1 is not being adapted, and it may also be advantageous if either Layer 1 or Layer 2 is being adapted using algorithms in programming code. Those skilled in the art will recall that the correction values in LUTs 38*a-c* may be updated and/or optimized by receiver 18, as shown in FIG. 1.

The requirements may be implemented using power detector 48 and processor 50. Power detector 48, coupled to RF combiner 44*c*, samples a portion of the signal power from the Layer 2 long and short paths. The sampled power is then coupled to processor 50. Processor 50 is coupled to variable delay circuits (Variable Delay_D) 46*a* and (Variable Delay_

2) 46*b* and configured to set the delay based on the sampled power and the four requirements thereby dynamically controlling the variable delay circuits (Variable Delay_D) 46*a* and (Variable Delay_2) 46*b*.

Processor 50 may operate under the control of an operating system, and execute or otherwise rely upon various computer software applications, components, programs, objects, modules, data structures, etc. In general, the routines executed to implement the software-implemented aspects of the invention, whether implemented as part of an operating system or a specific application, component, program, object, module or sequence of instructions, or even a subset thereof, will be referred to herein as "computer program code," or simply "program code." Program code typically comprises one or more instructions that are resident at various times in various memory and storage devices associated with a processor, and that, when read and executed by the processor, cause that processor to perform the steps necessary to execute steps or elements embodying the various aspects of the invention. Moreover, while the invention has and hereinafter will be described in the context of fully functioning processors, those skilled in the art will appreciate that the various embodiments of the invention are capable of being distributed as a program product in a variety of forms, and that the invention applies equally regardless of the particular type of signal bearing media used to actually carry out the distribution. Examples of signal bearing media include but are not limited to recordable type media such as volatile and non-volatile memory devices, floppy and other removable disks, hard disk drives, magnetic tape, optical disks (e.g., CD-ROMs, DVDs, etc.), among others, and transmission type media such as digital and analog communication links.

It will be appreciated that a wide variety of processors may be used to implement the functionality of processor 50. Moreover, it will be appreciated that the implementation of the herein-described functionality in software, or alternatively using hardware, would be well within the abilities of one of ordinary skill in the art having the benefit of the instant disclosure.

Alternatively, or in addition to the four requirements discussed above, predistorter 30 may include vector modulators (Vector Modulator #3, Vector Modular #4) 40*d*, 40*e*, with associated respective fixed value LUTs 42*a*, 42*b*. The digital output of ADC circuit 34 is also used to recall fixed pairs of control signal values, e.g., $V_{31}$ and $V_{32}$, and $V_{41}$ and $V_{42}$, from fixed value LUTs 42*a*, 42*b*, respectively. These pairs of control signals are applied to vector modulators 40*d* and 40*e*, whose functions are to modify the magnitude and phase of the RF input signal (RF IN) in accordance with the control signals. The values of the fixed pairs of control signal values, $V_{31}$ and $V_{32}$, and $V_{41}$ and $V_{42}$, in fixed value LUTs 42*a*, 42*b*, are selected such that vector modulators (Vector Modulator #3, Vector Modular #4) 40*d*, 40*e* provide signals that substantially cancel any portion of the original RF carrier signal appears at, or bleeds through to, the outputs of vector modulators (Vector Modulator #1, Vector Modulator #2) 40*b*, 40*c*, resulting in a spurious emission at the output of RF amplifier 14.

Figure 3:
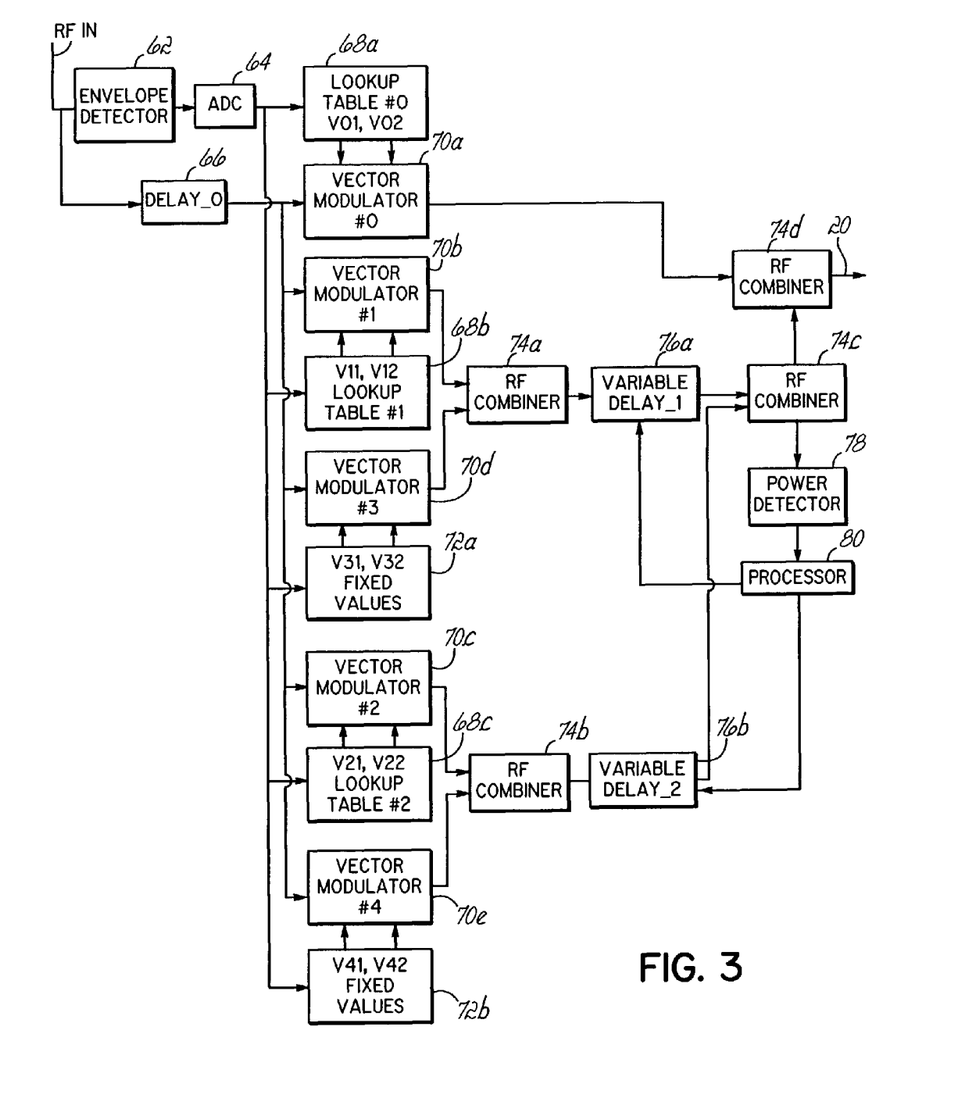
FIG. 3 shows a block diagram of an implementation of a time-delay RF based predistorter, in accordance with an embodiment of the present invention; and, FIGS. 4 and 5 show block diagrams of alternative implementations of the RF based predistorters of FIGS. 2 and 3.
Figure 4:
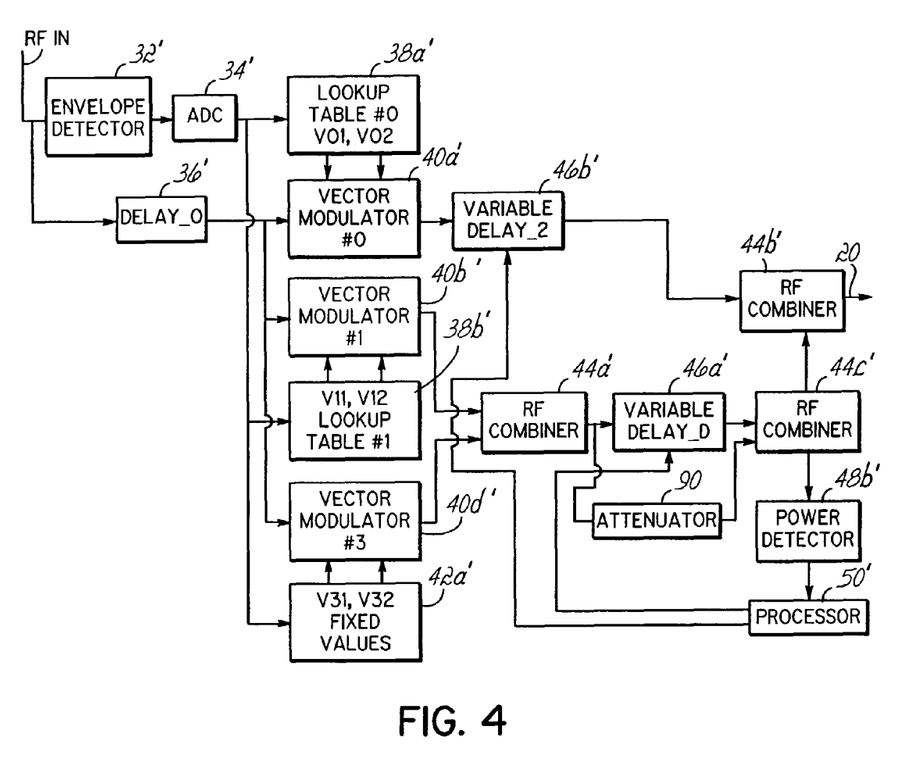
Figure 5:
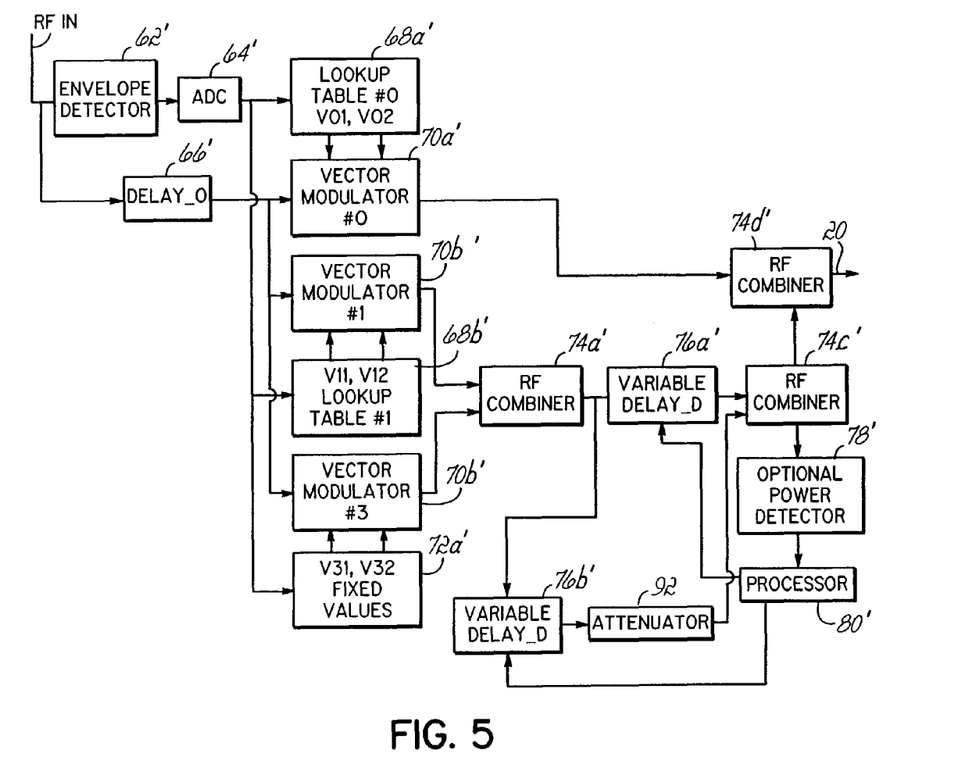

Those skilled in the art will appreciate that both the technique using the requirements and the technique using the additional fixed value LUTs and vector modulators may be used alone or in combination as complementary, and, as such, FIG. 2 as well as FIGS. 3-5 show the techniques in combination. Those skilled in the art will appreciate that in other embodiments of the present invention the fixed value look-up tables may be programmable look-up tables as well.

While FIG. 2 illustrates a time-advance implementation of a RF predistortion, FIG. 3 shows a time-delay implementation. Referring to FIG. 3, the Layer 1 path and the Layer 2 long and short paths, and the components that comprise each, in a predistorter 60 will be described. Predistorter 60 comprises envelope detector circuit 62, analog-to-digital converter (ADC) circuit 64, delay circuit (Delay_0) 66, LUTs 68*a-c*, vector modulators 70*a-e*, fixed value tables 72*a*, 72*b*, RF combiners 74*a-d*, variable delay circuits (Variable Delay_1, Variable Delay_2) 76*a*, 76*b*, power detector 78, and processor 80.

Turning to the three delay paths, from input (RF IN) to output (indicated at reference numeral 20), the Layer 1 path comprises delay circuit (Delay_0) 66, vector modulator (Vector Modulator #0) 70*a*, and RF combiner 74*d*. Similarly, the Layer 2 long path comprises delay circuit (Delay_0) 66, vector modulator (Vector Modulator #1) 70*b*, RF combiner 74*a*, variable delay circuit (Variable Delay_1) 76*a*, RF combiner 74*c*, and RF combiner 74*d*. The Layer 2 short path comprises delay circuit (Delay_0) 66, vector modulator (Vector Modulator #2) 70*c*, RF combiner 74*b*, variable delay circuit (Variable Delay_2) 76*b*, and RF combiners 74*c*, 74*d*.

In FIG. 3, the RF input signal (RF IN) is coupled to envelope detector circuit 62 and delay circuit (Delay_0) 66, splitting the signal between the envelope detector circuit 62 and the delay circuit (Delay_0) 66. Envelope detector circuit 62 produces an output signal proportional to the instantaneous value of the RF input power (RF IN). This signal is digitized by ADC circuit 64 whose digital output is used to recall pairs of control signal values, e.g., voltages $V_{01}$ and $V_{02}$, $V_{11}$ and $V_{12}$, and $V_{21}$ and $V_{22}$, from LUTs 68*a-c*, respectively. The pairs of control signals are applied to vector modulators 70*a-c*, whose functions are to modify the magnitude and phase of the RF input signal (RF IN) in accordance with the control signals. The portion of the RF input signal (RF IN) coupled to delay circuit 66, causes the RF input signal (RF IN) to arrive at vector modulators 70*a-c* at substantially the same time as the control signal values. Thus, the output of delay circuit (Delay_0) 66 is coupled to vector modulators 70*a-c*.

The output of vector modulator (Vector Modular #0) 70*a* is coupled to RF combiner 74*d*. The output of vector modulator (Vector Modular #1) 70*b* is coupled to RF combiner 74*a*, which is in turn coupled to variable delay circuit (Variable Delay_1) 76*a*. The output of vector modulator (Vector Modular#2) 70*c* is coupled to RF combiner 74*b*, which is in turn coupled to variable delay circuit (Variable Delay_2) 76*b*. Vector modulator 70*a* is configured such that, in the absence of control signal inputs, the RF input signal (RF IN) passes through without, or with minimal, distortion, whereas vector modulators 70*b* and 70*c* are configured such that, in the absence of control signal inputs, little or no RF signal passes through. Thus, when control signals are applied, vector modulator 70*a* produces the original RF signal (RF IN) plus a predistorted signal, whereas vector modulators 70*b* and 70*c* produce essentially predistortion signals only, based on values in LUTs 68*a-c*.

In operation, the set of requirements described in conjunction with embodiment 30 shown in FIG. 2 may be adapted and used to describe the setting of variable delay circuits (Variable Delay_1)76*a* and (Variable Delay_2) 76*b*. Again, and more specifically, the first of these requirements states that if no delay is added to the Layer 1 path, the Layer 2 short path need have the same insertion phase and delay as the Layer 1 path. In this embodiment, it will be appreciated that there is no ability to add delay to the Layer 1 path. The second requirement states that if no delay is added to the Layer 2 long path, the Layer 2 long path need have 180 degrees of additional insertion delay but the same insertion delay as the Layer 1 path. The third requirement states that an amount of delay, e.g., X nanoseconds (nS), may be added to the Layer 2 short path, while twice as much delay, e.g., 2X nS, may then be added to the Layer 2 long path using variable delay circuit (Variable Delay_1) 76a. Again, it will be appreciated that there is no ability to add delay to the Layer 1 path in this embodiment.

Based on these three requirements, a cancellation null will occur at the at the operating frequency of RF power amplifier 14 (shown in FIG. 1), so long as the operating frequency is the same as the frequency used to generate the correction values in the LUTs 68a-c. Moreover, the values in the LUT 68a and LUTs 68b and 68c remain independent, as do Layers 1 and 2.

However, as practical matter, it is often desirable to operate RF power amplifier 14 at some frequency other than the frequency used to generate the correction values in the LUTs 68a-c. When RF power amplifier 14 is operated at a frequency other than the frequency used to generate the correction values in the LUTs 68a-c, a cancellation null will not occur at the operating frequency and a portion of the original RF carrier signal appears at, or "bleeds through" to, the outputs of variable delay circuits (Variable Delay_1) 76a and (Variable Delay_2) 76b, resulting in a spurious emission at the output of RF amplifier 14.

One approach to preventing such a spurious emission, is to adjust the correction values in LUTs 68a-c. Such an adjustment makes the correction values in LUT 68a and LUTs 68b and 68c interdependent. The interdependence of the correction values in LUTs 68a-c in Layers 1 and 2 generally prevents independent operation of each layer that allows for independent tuning and/or alignment of the LUTs.

Generation of the correction values in the LUTs may also become an iterative process. For example, in order to minimize spurious emissions, correction values in LUT 68a in Layer 1 are generated while Layer 2 is turned off. Next, Layer 1 is turned off while correction values for LUTs 68b and 68c in Layer 2 are generated. Multiple iterations between Layers 1 and 2 are often required to eliminate the presence of the carrier in the Layer 2 RF long and short paths, reducing any spurious emissions associated therewith. This process is repeated until the spurious emissions are eliminated or reduced to a satisfactory level.

In addition, the further the operating frequency is from the frequency used to generate the initial correction values in LUTs 68a-c, the more iterative the process becomes. Thus, a frequency located at the center of the operating band of the RF power amplifier is typically selected to generate the initial correction values. RF power amplifiers, such as RF power amplifier 14, used for digital modulation schemes typically have sufficient operating bandwidth to make generating correction values in the LUTs difficult even when a frequency located at the center of the band is selected for initial generation of correction values. More particularly, those frequencies located at the upper and lower extremes of the operating band are typically the most difficult to generate correction values for, e.g., requiring a high number of iterations, and making the correction values in LUTs 68a-c in each Layers 1 and 2 more interdependent.

In accordance with the present invention, and to maintain independence of correction values in LUT 68a and LUTs 68b and 68c in Layers 1 and 2, respectively, the fourth requirement is provided. The fourth requirement states that the delay added to the Layer 2 long path, e.g., 2X nS, be an integer number of wavelengths long relative to the delay in the Layer 2 short path at the operating frequency. The fourth requirement causes a cancellation null to occur centered at the operating frequency, irrespective of the correction values in LUT 68a and LUTs 68b and 68c in Layers 1 and 2. Thus, the LUTs 68a-c in each layer are independent and may be easily created. Moreover, since the LUTs 68a-c are independent at all frequencies, one layer may be operated without impacting the performance of the other.

For example, the when the cancellation null occurs at the operating frequency of RF power amplifier 14, correction values in LUT 68a generated for Layer 1 correction is not impacted by the addition of correction associated with Layer 2. Moreover, correction values for LUT 68a may be generated and need not be modified after Layer 2 is made active. Additionally, activating Layer 2 does not impact the operating power of RF power amplifier 14 since the majority of the carrier power that may have bleed through Layer 2 is removed by the cancellation null. This independence of the correction values in the Layer 1 and Layer 2 LUTs 68a-c allows the LUTs 68a-c to be generated without iterating between the Layer 1 and Layer 2 paths.

Further, Layer 2 may be deactivated to allow the evaluation of the effectiveness of the Layer 1 correction, which may only occur when the correction values in LUTs 68a-c are independent. The ability to deactivate Layer 2 correction may be particularly advantageous if there is a failure in the Layer 2 circuitry and Layer 1 is not being adapted, and it may also be advantageous if either Layer 1 or Layer 2 is being adapted using algorithms in programming code. Those skilled in the art will recall that the correction values in LUTs 68a-c may be updated and/or optimized by receiver 18, as shown in FIG. 1.

The requirements may be implemented using power detector 78 and processor 80. Power detector 78, coupled to RF combiner 74c, samples a portion of the signal power from the Layer 2 long and short paths. The sampled power is then coupled to processor 80. Processor 80 is coupled to variable delay circuits (Variable Delay_1) 76a and (Variable Delay_2) 76b and configured to set the delay based on the sampled power and the four requirements thereby dynamically controlling the variable delay circuits (Variable Delay_1) 76a and (Variable Delay_2) 76b.

Alternatively, or in addition to the four requirements discussed above, predistorter 60 may include vector modulators (Vector Modulator #3, Vector Modular #4) 70d, 70e, with associated respective fixed value LUTs 72a, 72b. The digital output of ADC circuit 34 is also used to recall fixed pairs of control signal values, e.g., $V_{31}$ and $V_{32}$, and $V_{41}$ and $V_{42}$, from fixed value LUTs 72a, 72b, respectively. These pairs of control signals are applied to vector modulators (Vector Modulator #3) 70d and (Vector Modular #4) 70e, whose functions are to modify the magnitude and phase of the RF input signal (RF IN) in accordance with the control signals. The values of the fixed pairs of control signal values, $V_{31}$ and $V_{32}$, and $V_{41}$ and $V_{42}$, in fixed value LUTs 72a, 72b, are selected such that vector modulators (Vector Modulator #3, Vector Modular #4) 70d, 70e provide signals that substantially cancel any portion of the original RF carrier signal appears at, or bleeds through to, the outputs of vector modulators (Vector Modulator #1, Vector Modulator #2) 70b, 70c, resulting in a spurious emission at the output of RF amplifier 14.

In some embodiments, it has been found that that the contents of LUT 38c shown in FIG. 2 may be approximated by the contents of LUT 38b, also shown in FIG. 2, multiplied by a constant. Similarly, the contents of LUT 70c shown in FIG. 3 may be approximated by the contents of LUT 70b, also shown in FIG. 3, multiplied by a constant. In such embodiments, predistorters 30 and 60 of FIGS. 2 and 3 may be simplified as embodiments 30' and 60' shown in FIGS. 4 and 5, respectively. In these figures, primed numbers denote corresponding components to those in the previous figures.

Referring to FIG. 4, vector modulator (Vector Modulator#2) 40*c* and its associated LUT 38*c* may be eliminated from embodiment 30' as shown, with the output of RF combiner 44*a'* being split into two paths, one of which is attenuated relative to the other by an attenuator 90. Vector modulator (Vector Modulator #4) 40*e* and its associated fixed value LUT 42*b* may also be eliminated along with RF combiner 44*b* as shown.

Referring to FIG. 5, and in like manner, vector modulator (Vector Modulator #2) 70*c* and its associated LUT 68*c* may be eliminated from embodiment 60' as shown, the output of RF combiner 74*a'* being split into two paths, one of which is attenuated relative to the other by an attenuator 92. Vector modulator (Vector Modulator #4) 70*e* and its associated fixed value LUT 72*b* may also be eliminated along with RF combiner 74*b* as shown.

In FIG. 4, attenuator 90 may be placed in the path shown when the value of the constant relating the values in LUT 38*c* to the values in LUT 38*b* of FIG. 2 is less than one. When the value of the constant is greater than one, attenuator 90 is preferably placed in the other path. Similarly, in FIG. 5, attenuator 92 may be placed in the path shown when the value of the constant relating the values in LUT 68*c* to the values in LUT 68*b* of FIG. 3 is less than one. When the value of the constant is greater than one, attenuator 92 is preferably placed in the other path.

Embodiments 30' and 60' of FIGS. 4 and 5 produce similar results to embodiments 30 and 60 of FIGS. 2 and 3, respectively, when the predistortion parameters in LUTs 38*c*, 68*c* of one embodiment have the opposite sign as the predistortion parameters in the corresponding LUT 38*b*, 68*b* of the other embodiment. It will be appreciated that embodiments 30' and 60' of FIGS. 4 and 5 function in like manner to embodiments 30 and 60 of FIGS. 2 and 3 otherwise.

While the present invention has been illustrated by the description of the embodiments thereof, and while the embodiments have been described in considerable detail, it is not the intention of the applicants to restrict or in any way limit the scope of the appended claims to such detail. For example, although the embodiments of the present invention have been described in the context of wireless signals transmitted from a base station to one or more wireless mobile units, embodiments of the present invention may also be used to transmit from a wireless mobile unit to a base station. Further, embodiments of the present invention may also be implemented in other wireless communications networks to reduce spurious emissions.

The present invention may also be embodied as circuit based processes, such as in an integrated circuit. Moreover, the function of various circuit elements described herein may be implemented as processing steps in a software program. Such a software program may be executed by digital signal processors, embedded processors, microprocessors, general-purpose computers, etc. Additional advantages and modifications will readily appear to those skilled in the art. Therefore, the invention in its broader aspects is not limited to the specific details representative apparatus and method, and illustrative examples shown and described. Accordingly, departures may be made from such details without departure from the spirit or scope of applicants' general inventive concept.

What is claimed is:

1. A predistorter for reducing spurious emissions in an amplified signal comprising:
   a first path configured to generate memory-less distortion correction;
   a second path configured to generate memory distortion correction; and
   at least one dynamically controllable delay circuit located in at least one of the first and second paths and configured to render the memory-less and memory distortion corrections independent from one another over a plurality of operating frequencies for the predistorter, wherein the first path is disposed in a first layer, and the second path is disposed in a second layer, wherein the second layer further comprises a third path, wherein the second path is a second layer long path and the third path is a second layer short path, and wherein the dynamically controllable delay circuit is configured to add a delay to the second layer long path that is an integer number of wavelengths long relative to a delay added to the second layer short path at the frequency of use of the predistorter.

2. The predistorter of claim 1, wherein the first path is configured with the same insertion phase and delay as the second layer short path.

3. The predistorter of claim 1, wherein the second layer long path is configured with 180 degrees of additional insertion phase but the same insertion delay as the second layer short path.

4. The predistorter of claim 1, wherein the first path is configured with twice as much delay as the second layer long path.

5. The predistorter of claim 1, further comprising a processor coupled to the at least one dynamically controllable delay circuit and configured to select the delay added by the dynamically controllable delay circuit.

6. The predistorter of claim 1, further comprising a plurality of look-up tables, each associated with a path and configured to produce a correction signal that is equal but opposite in magnitude and phase to at least a portion of non-linearities associated with an RF power amplifier.

7. The predistorter of claim 6, further comprising a processor, the processor configured to update the look-up tables based on an amplified signal.

8. The predistorter of claim 1, further comprising a combiner configured to combine the first and second paths.

9. An apparatus comprising:
   an RF amplifier configured to amplify a signal; and,
   a predistorter coupled to the RF amplifier and configured to reduce spurious emissions in an amplified signal, the predistorter comprising:
   a first path configured to generate memory-less distortion correction;
   a second path configured to generate memory distortion correction;
   at least one dynamically controllable delay circuit located in at least one of the first and second paths and configured to render the memory-less and memory distortion corrections independent from one another over a plurality of frequencies for the predistorter;
   wherein the first path is disposed in a first layer, and the second path is disposed in a second layer, wherein the second layer further comprises a third path, wherein the second path is a second layer long the third path is a second layer short path, and wherein the dynamically controllable delay circuit is configured to add a delay to the second layer long path that is an integer number of wavelengths long relative to a delay added to the second layer short path at the frequency of use of the predistorter.

10. The apparatus of claim 9, wherein the first path is configured with the same insertion phase and delay as the second layer short path.

11. The apparatus of claim 9, wherein the second layer long path is configured with 180 degrees of additional insertion phase but the same insertion delay as the second layer short path.

12. The apparatus of claim 9, wherein the first path is configured with twice as much delay as the second layer long path.

13. The apparatus of claim 9, the predistorter further comprising a processor coupled to the at least one dynamically controlled delay circuit and configured to select delay.

14. The apparatus of claim 9, the predistorter further comprising a plurality of look-up tables, each associated with a path and configured to produce a correction signal that is equal but opposite in magnitude and phase to at least a portion of non-linearities associated with the RF power amplifier.

15. The apparatus of claim 14, wherein the look-up tables are updated based on an amplified signal.

16. The apparatus of claim 9, wherein the predistorter further comprises a combiner configured to combine the first and second paths.

17. A method of reducing spurious emissions in an amplified signal using a predistorter wherein the predistorter includes first and second paths and at least one delay circuit located in at least one of the first and second paths, the method comprising:

correcting for memory-less distortion using the first path;

correcting for memory distortion using the second path; and, dynamically controlling the delay circuit to render the memory-less and memory distortion corrections independent from one another over a plurality of operating frequencies for the predistorter;

wherein the first path is disposed in a first layer, and the second path is disposed in a second layer, wherein the second layer further comprises a third path, wherein the second path is a second layer long path and the third path is a second layer short path, and wherein dynamically controlling the delay circuit comprises adding delay to the second layer long path that is an integer number wavelengths long relative to delay added to the second layer short path.

18. The method of claim 17, wherein dynamically controlling the delay circuit comprises setting the first path and the second layer short path with the same insertion phase and delay.

19. The method of claim 17, wherein dynamically controlling the delay circuit comprises setting the second layer long path with 180 degrees of additional insertion phase but the same insertion delay as the second layer short path.

20. The method of claim 17, wherein dynamically controlling the delay circuit comprises setting the delay of the first path with twice as much delay as the second layer long path.

21. The method of claim 17, further comprising producing a correction signal using look-up tables that is equal but opposite in magnitude and phase to a least a portion of non-linearities associated with an RF power amplifier.

22. The method of claim 21, further comprising updating the look-up tables based on an amplified signal.

23. The method of claim 17, further comprising combining the first and second paths.

* * * * *